United States Patent [19]
Hashiguchi et al.

[11] Patent Number: 6,089,895
[45] Date of Patent: Jul. 18, 2000

[54] CARD CONNECTOR

[75] Inventors: Osamu Hashiguchi, Akishima; Yasufumi Yahiro, Tachikawa; Keisuke Nakamura, Akishima, all of Japan

[73] Assignee: Japan Aviation Electronics Industry, Limited, Tokyo, Japan

[21] Appl. No.: 09/056,200

[22] Filed: Apr. 6, 1998

[30] Foreign Application Priority Data

May 21, 1997 [JP] Japan .................................. 9-147290
Jun. 3, 1997 [JP] Japan .................................. 9-160421

[51] Int. Cl.$^7$ .................................................. H01R 13/629
[52] U.S. Cl. ........................................... 439/260; 439/267
[58] Field of Search .................................. 439/259, 260, 439/261, 266, 267, 140, 141

[56] References Cited

U.S. PATENT DOCUMENTS

| | | | |
|---|---|---|---|
| 4,795,897 | 1/1989 | Chalendard | 439/260 |
| 4,839,509 | 6/1989 | Yasuma et al. | 439/260 |
| 4,904,852 | 2/1990 | Mita et al. | 439/260 |
| 4,931,622 | 6/1990 | Ohtsuki et al. | 439/267 |
| 4,961,710 | 10/1990 | Komatsu | 439/260 |

*Primary Examiner*—Hien Vu
*Attorney, Agent, or Firm*—Frishauf, Holtz, Goodman, Langer & Chick, P.C.

[57] ABSTRACT

A card connector which permits insertion of a card from a side of an insulator thereof is provided. A protruded portion is formed on the bottom of a rear end of a slider movably accommodated with a hollow insulator. When the slider is moved in the direction of insertion of a card (miniature card) to bring a recessed terminal array portion of the card to a position exactly above a protruded terminal array portion of a circuit board, the protruded portion is caused to drop into a recess formed in a bottom wall of the hollow insulator to thereby incline the slider with respect to the direction of insertion of the card to fit the recessed terminal array portion of the miniature card on the protruded terminal array portion of the circuit board. The slider is urged against the bottom wall of the hollow insulator by a spring, and urged toward an insertion opening of the hollow insulator by another spring. An ejector button is arranged in the hollow insulator for returning the card to a level position.

5 Claims, 12 Drawing Sheets

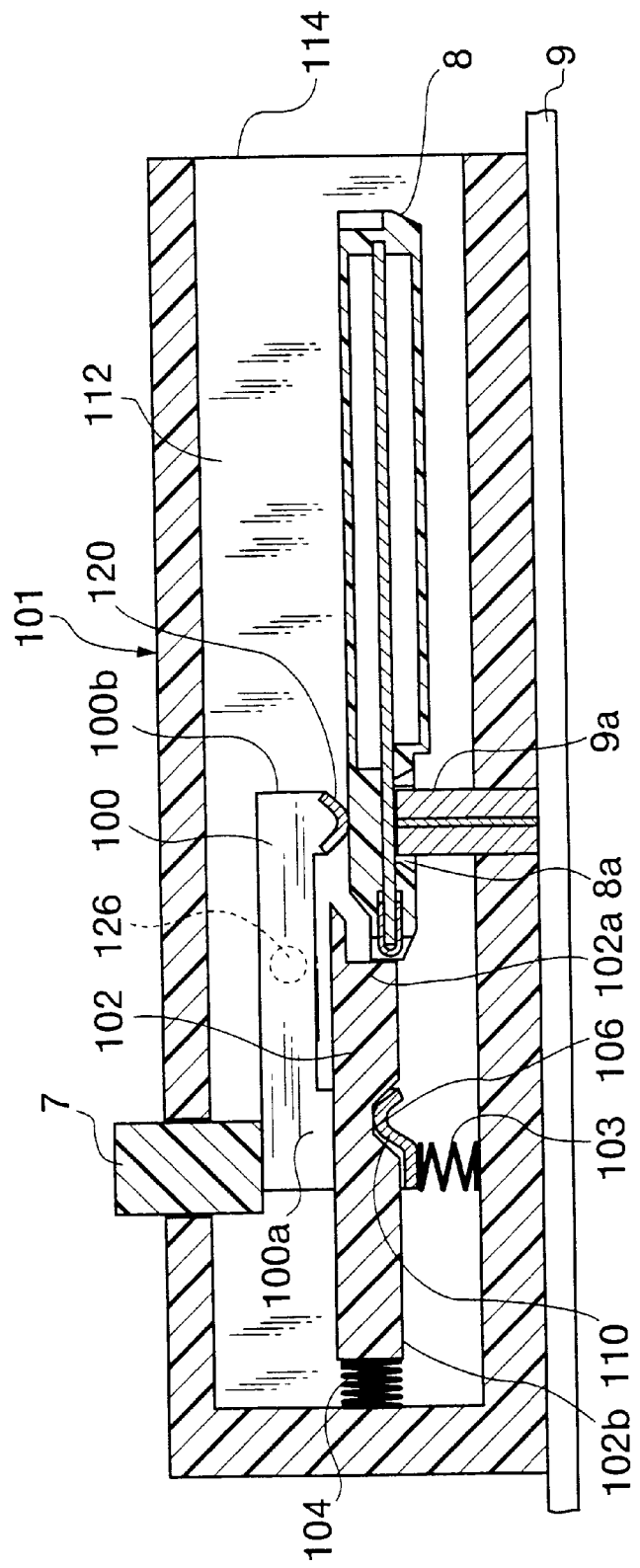

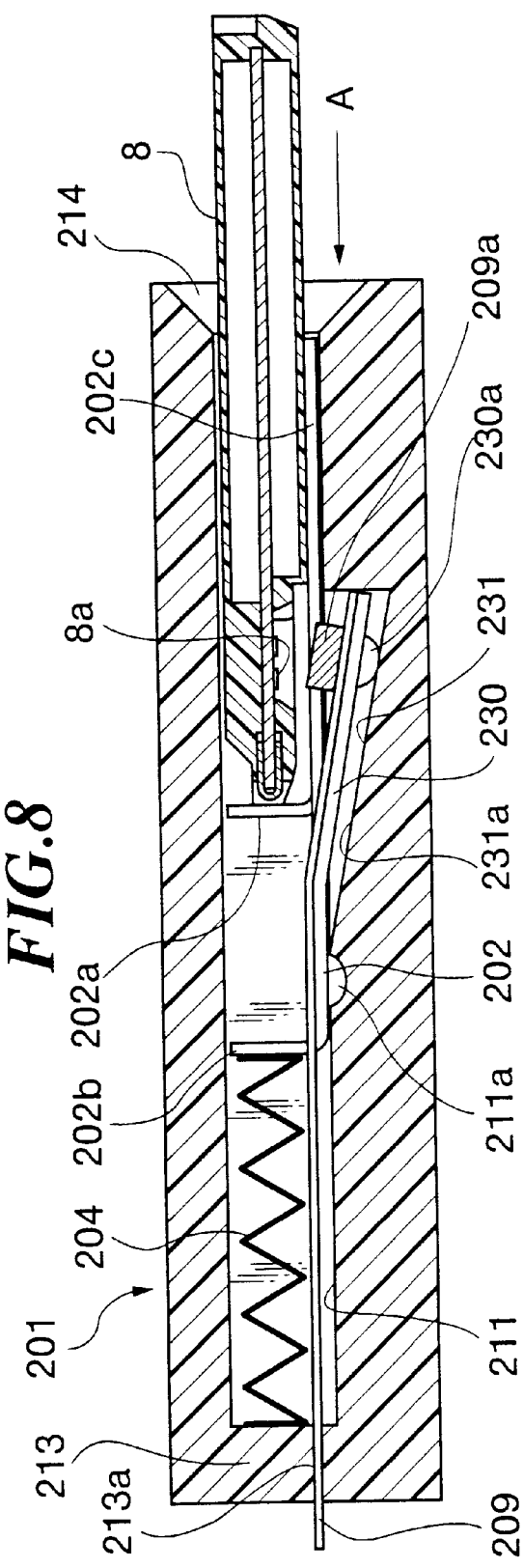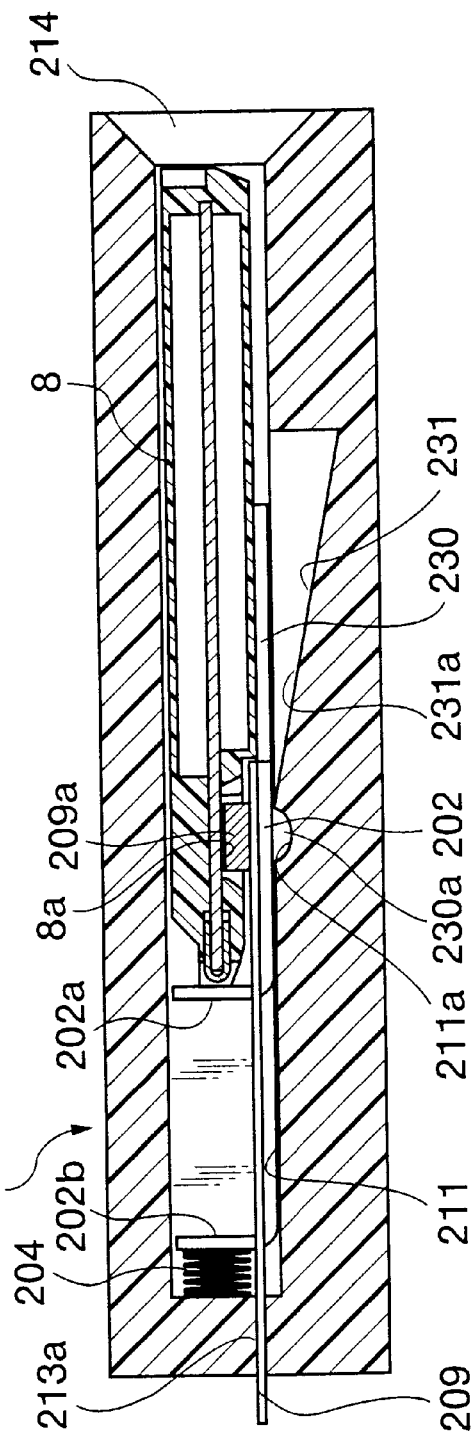

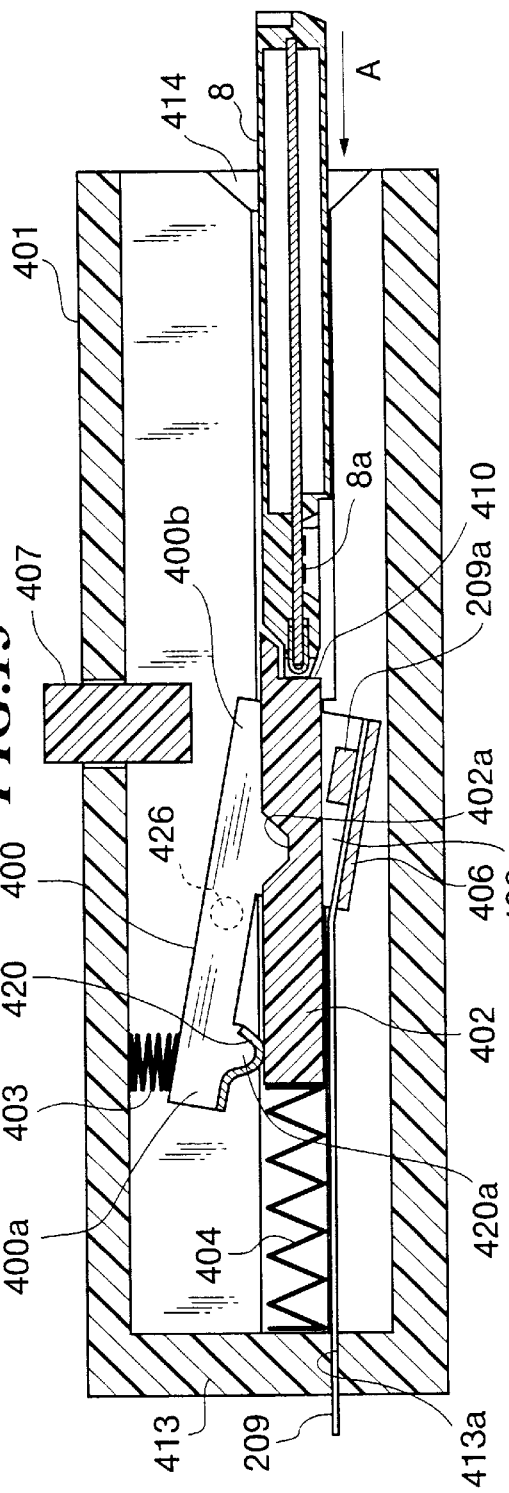
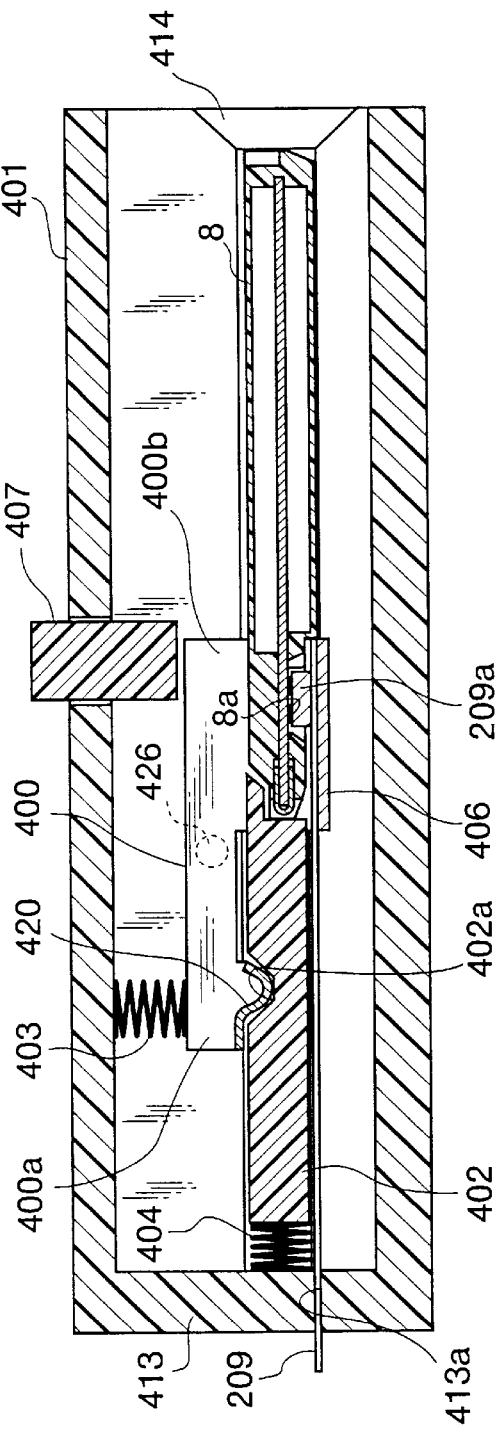

CARD CONNECTOR

BACKGROUND OF THE INVENTION

1. Field of the Invention

This invention relates to a card connector, and more particularly to a card connector which is suitably used as a connector of miniature cards.

2. Description of the Prior Art

FIG. 1 is a cross-sectional view of a digital still camera incorporating a conventional card connector.

On an upper surface 500a of a camera casing 500, there are arranged a liquid crystal display panel 600 and a card connector 700.

A protruded terminal array portion 9a of a circuit board, not shown, contained in the camera casing 500 extends through a bottom wall 711 of a box-shaped insulator 701 of the card connector 700 to protrude into the inside of the insulator 701.

The insulator 701 has a top wall 710 formed with an insertion hole 714 via which a miniature card 8 is inserted from outside.

To mount the miniature card 8 in the insulator 701, the front end of the miniature card 8 is hooked under an edge of the insertion hole 714 and pivotally moved downward about the hooked front end.

As a result, the protruded terminal array portion 9a of the circuit board is fitted in a recessed terminal array portion 8a of the miniature card 8 to establish electrical connection between the miniature card 8 and the circuit board.

In the conventional card connector, as described above, the insertion hole 714 is formed in the top wall 710 of the insulator 701 and hence the miniature card 8 is required to be inserted into and removed from the camera casing 500 via an upper surface-side of the camera casing 500.

Therefore, the conventional card connector suffers from the problem that only a small-sized liquid crystal display panel can be mounted on the upper surface 500a of the camera casing 500.

To install a large-sized liquid crystal display panel, the camera casing 500 is required to be increased in size, which goes against the demand of downsizing of the digital still camera.

To avoid the above inconvenience, a method is contemplated in which the miniature card 8 is inserted via one of the sides of the insulator 701. However, if the insertion hole 714 of the insulator 701 is simply changed in location, the front end of the miniature card 8 would abut against the protruded terminal array portion 9a of the circuit board, which is protruded into the inside of the insulator 701, to deform the same.

SUMMARY OF THE INVENTION

It is the object of the invention to provide a card connector which is capable of inserting and removing a card therein and therefrom via a side of an insulator thereof.

To attain the above object, according to a first aspect of the invention, there is provided a card connector for electrically connecting a card to a circuit board, the card connector including a hollow insulator having a bottom wall and an insertion opening through which the card is inserted therein, and a protruded terminal array portion of the circuit board, which extends through the bottom wall of the hollow insulator to protrude into an inside of the hollow insulator, the card having a recessed terminal array portion, wherein the protruded terminal array portion and the recessed terminal array portion are arranged to be engaged with each other for electrical connection between the card and the circuit board, the card connector further comprising:

a slider movably accommodated within the hollow insulator for guiding the card to the protruded terminal array portion, the slider having a rear end:

a protruded portion formed on a bottom of the rear end of the slider;

a first urging member for urging the slider toward the bottom of the hollow insulator;

the bottom wall of the hollow insulator having a hole formed therein, the hole being formed at a location which engages with the protruded portion of the slider when the recessed terminal array portion of the card guided by the slider is at a position exactly above the protruded terminal array portion of the circuit board, whereby when the recessed terminal array postion of the card is brought to the position exactly above the protruded terminal array portion, the protruded portion of the slider is caused to drop into the hole by an urging force of the first urging member so that the slider is brought into an inclined position which is inclined with respect to a direction of insertion of the card to thereby cause the recessed terminal array portion of the card to engage with the protruded terminal array portion of the circuit board, card-ejecting means for returning the card from the inclined position to a level position to thereby disengage the recessed terminal array portion of the card from the protruded terminal array portion of the circuit board; and a second urging member for pushing back the slider toward the insertion opening of the hollow insulator when the recessed terminal array portion of the card is disengaged from the protruded terminal array portion of the circuit board by the card-ejecting means.

According to the card connector of the first aspect of the invention, when the recessed terminal array portion of the card is brought to a position exactly above the protruded terminal array portion of the circuit board, the protruded portion of the slider is caused to drop into the hole formed in the bottom of the hollow insulator by the urging force of the first urging member, so that the slider is inclined to fit the recessed terminal array portion of the card on the protruded terminal array portion of the circuit board to thereby electrically connect the two terminal array portions.

The card-ejecting means is operated to return the card to its level position whereby the recessed terminal array portion of the card is disengaged from the protruded terminal array portion of the circuit board fitted therein, and the slider and the card are pushed back in the direction of the insertion opening of the hollow insulator by the urging force of the second urging member.

Preferably, the slider has a front end portion against which the card abuts when the card is inserted into the hollow insulator, the hollow insulator having a top wall, the card-ejecting means being arranged in the top wall at a location corresponding in position to the front end portion of the slider when the protruded portion of the slider has been caused to drop into the hole of the bottom wall of the hollow insulator, for depressing the front end portion of the slider.

More preferably, the hollow insulator has a front wall, the second urging member is formed by a coil spring arranged between the front wall of the hollow insulator and the front end portion of the slider.

More preferably, the slider has side members opposed to each other, the side members having respective top portions, the first urging member comprising coil springs fixed to the respective top portions of the side members.

Further preferably, the slider has side members opposed to each other, the side members having respective bottom portions, the slider having a cross-member extending between the bottom portions, for supporting the card.

The above and other objects, features and advantages of the present invention will become more apparent from the following detailed description taken in conjunction with the accompanying drawings.

BRIEF DESCRIPTION OF THE DRAWINGS

FIG. 7 is a cross-sectional view of the FIG. 6 card connector in a state where the card has been inserted therein;

FIG. 8 is a cross-sectional view of a card connector according to a third embodiment of the invention, in a state where a card is being inserted therein;

FIG. 9 is a cross-sectional view of the FIG. 8 card connector, in a state where the card has been inserted therein;

FIG. 13 is a cross-sectional view of a card connector according to a fifth embodiment of the invention, in a state where a card is being inserted therein;

FIG. 14 is a cross-sectional view of the FIG. 13 card connector, in a state where the card has been inserted therein.

DETAILED DESCRIPTION OF THE PREFERRED EMBODIMENTS

Next, the invention will now be described in detail with reference to drawings showing preferred embodiments thereof.

Figure 1:
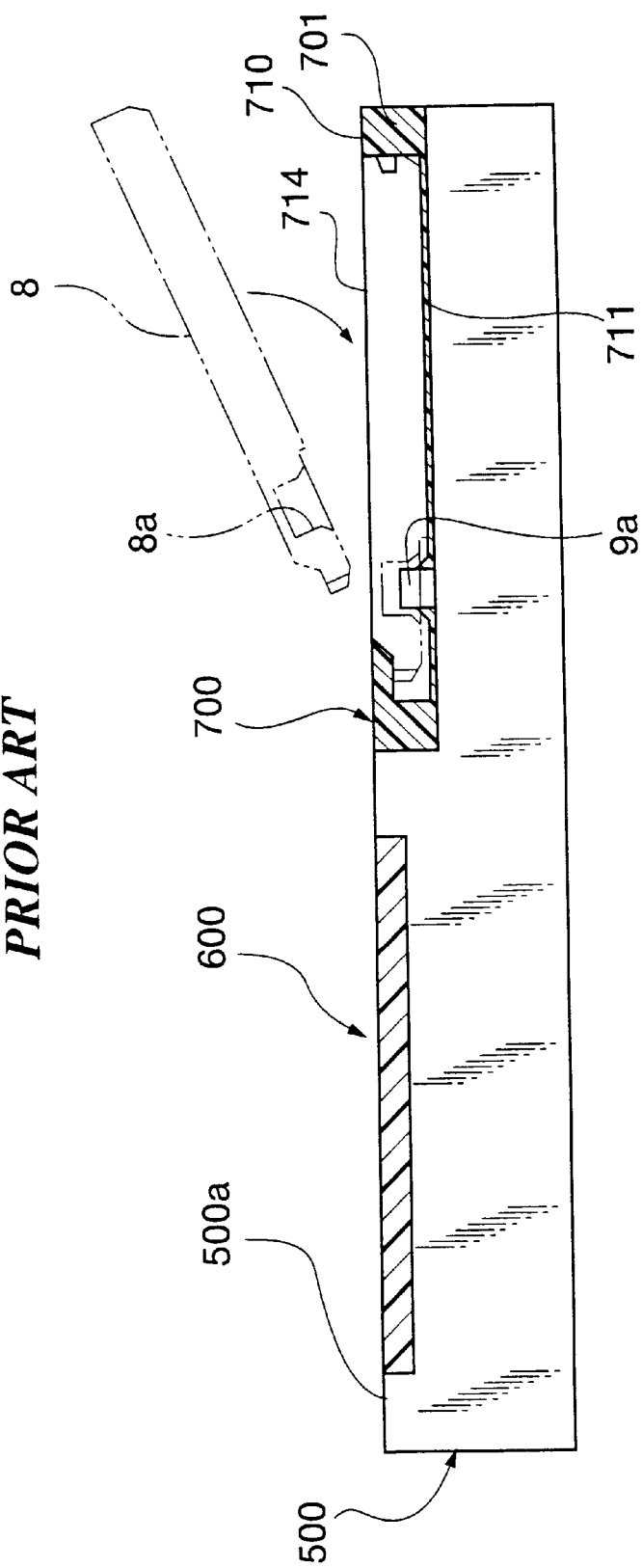
FIG. 1 is a cross-sectional view of a digital still camera incorporating a conventional card connector.
Figure 2:
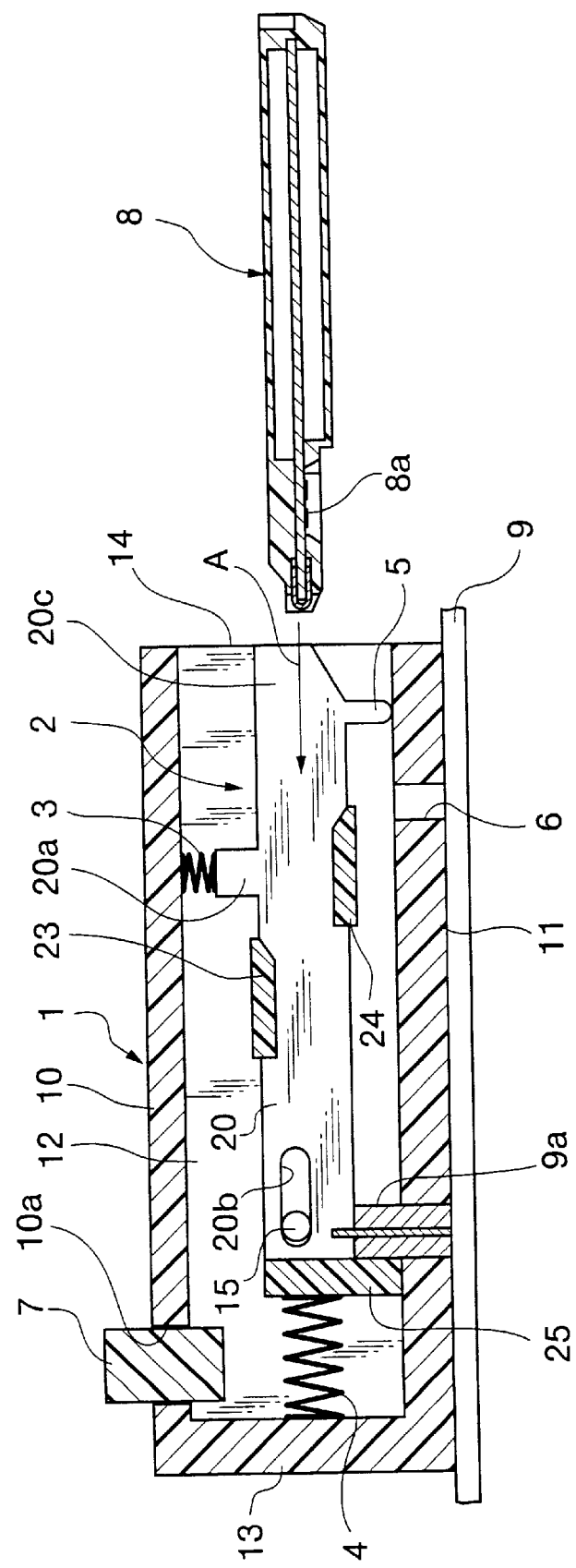
FIG. 2 is a cross-sectional view showing the whole arrangement of a card connector according to a first embodiment of the invention.
Figure 3:
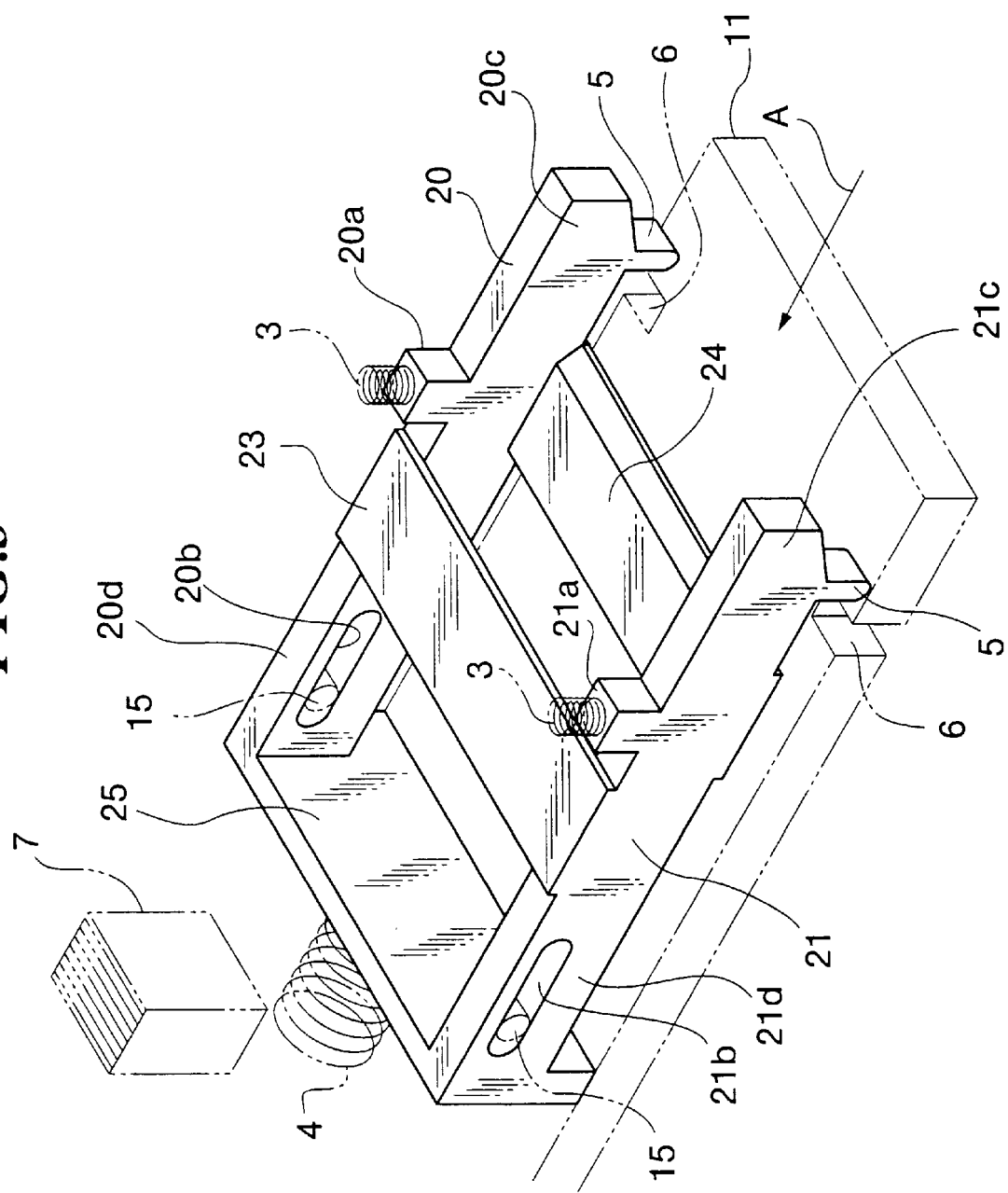
FIG. 3 is a perspective view of a slider appearing in FIG. 1.

FIG. 2 is a cross-sectional view showing the whole arrangement of a card connector according to a first embodiment of the invention. FIG. 3 is a perspective view of a slider. FIGS. 4A to 4C and FIGS. 5A to 5C are cross-sectional views of the card connector, which are useful in explaining the operation of the same.

The card connector is comprised of a box-shaped insulator 1, a slider 2 movably accommodated within the insulator 1, coil springs (first urging member) 3, 3 for urging the slider 2 against a bottom wall 11 of the insulator 1, a coil spring (second urging member) 4 for urging the slider 2 toward an insertion opening 14 of the insulator 1 via which a miniature card 8 is inserted into the card connector, projections 5, 5 provided at respective lower portions of a rear end of the slider 2, holes (recesses) 6, 6 formed through a bottom wall 11 of the insulator 1, and an ejector button (card-ejecting means) 7 for disengaging a recessed terminal array portion 8a of the miniature card 8 from a protruded terminal array portion 9a of a circuit board 9, on which the recessed terminal array portion 8a is fitted.

As shown in FIG. 3, the slider 2 includes side plates 20, 21 which are opposed to each other in a direction perpendicular to a card-inserting direction A. The plates 20, 21 are spaced from each other by a predetermined distance. An upper bridge or cross-member 23 extends between a portion of the top of the side plate 20 and a portion of the top of the side plate 21. A lower bridge cross-member 24 extends between a portion of the bottom of the side plate 20 and a portion of the bottom of the side plate 21. A front plate 25 extends between a front end 20d of the side plate 20 and a front end 21d of the side plate 21.

The bottom of the front plate 25 is in contact with the bottom wall 11 of the insulator 1.

The side plate 20 and the side plate 21 have a projection 20a and a projection 21a integrally formed therewith and extending upward from respective portions of their tops. The coil springs 3, 3 are fixed to the projections 20a, 21a, respectively, and slide in unison with the slider 2.

The side plates 20 and 21 have projections 5, 5 integrally formed therewith at respective lower portions of a rear end 20c and a rear end 21c thereof. The projections 5, 5 are in contact with the bottom wall 11 of the insulator 1.

The front ends 20d, 21d of the side plates 20, 21 are formed with elongate guide slots 20b, 21b, and pins 15 fixed to opposed side walls 12 of the insulator 1 are inserted into the elongate guide slots 20b, 21b, respectively.

The insulator 1 has a top wall 10, a bottom wall 11, side walls 12, an innermost wall 13, and an insertion opening 14.

The top wall 10 is formed with a through hole 10a in which the ejector button 7 is slidably mounted. The ejector button 7 is constantly urged upward by a return spring, not shown.

When the slider 2 is moved in the card-inserting direction A by the card 8 to allow the recessed terminal array portion 8a of the miniature card 8 to be brought to a position exactly above the protruded terminal array portion 9a of the circuit board 9, the projections 5, 5 of the slider 2 correspond in position to the holes 6, 6 of the bottom wall 11 of the insulator 1 and hence are caused to drop therein by the urging forces of the coil springs 3.

The above-mentioned spring 4 is arranged between the innermost wall 13 of the insulator 1 and the front plate 25 of the slider 2.

The recessed terminal array portion 8a of the miniature card 8 has sixty signal electrodes or contacts.

The protruded terminal array portion 9a of the circuit board 9 is constituted by layers of electrically conductive rubber and layers of an insulator joined such that exposed portions of the conductive layers correspond respectively to the sixty signal electrodes of the miniature card 8.

Next, the operation of the card connector constructed as above will be described with reference to FIGS. 4A to 4C and FIGS. 5A to 5C.

The miniature card 8 is inserted from the insertion opening 14 (see FIG. 4A) and guided into inner part of the insulator 1 by the side plates 20, 21 and the bridges 23, 24 of the slider 2.

Figure 4A:
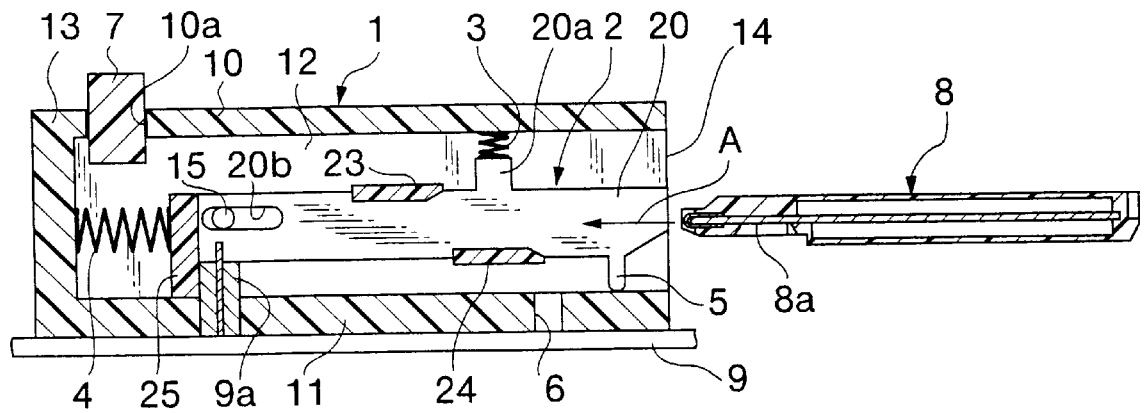
FIGS. 4A to 4C are cross-sectional views of the card connector, which are useful in explaining the operation of the same.
Figure 4B:
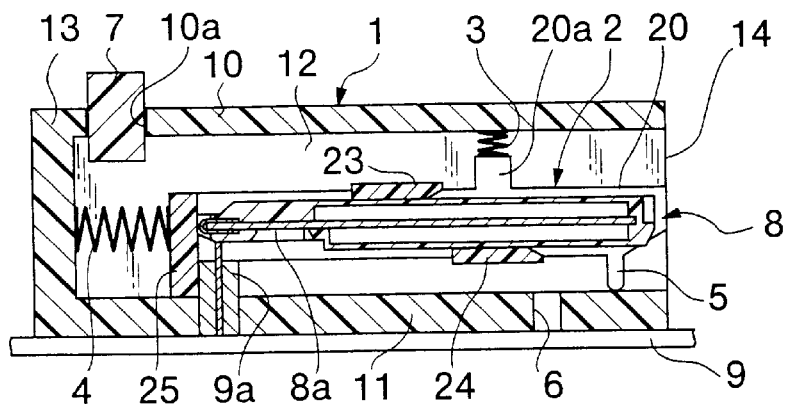

When the whole miniature card has been inserted, the front end of the miniature card abuts against the front plate 25 (see FIG. 4B).

Figure 4C:
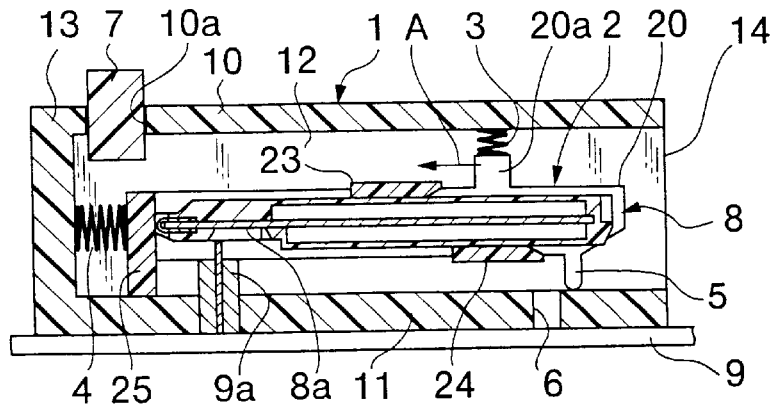

Then, the miniature card 8 and the slider 2 are moved together in the insulator 1 in the card-inserting direction A (see FIG. 4C).

Figure 5A:
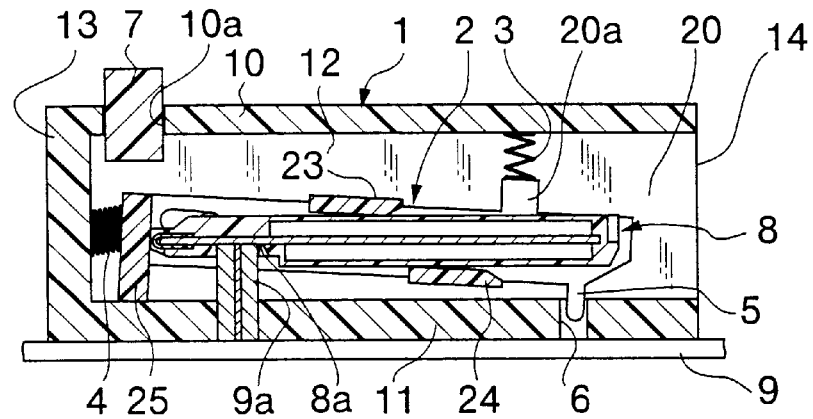
FIGS. 5A to 5C are cross-sectional views of the card connector, which are useful in explaining the operation of the same.
Figure 5B:
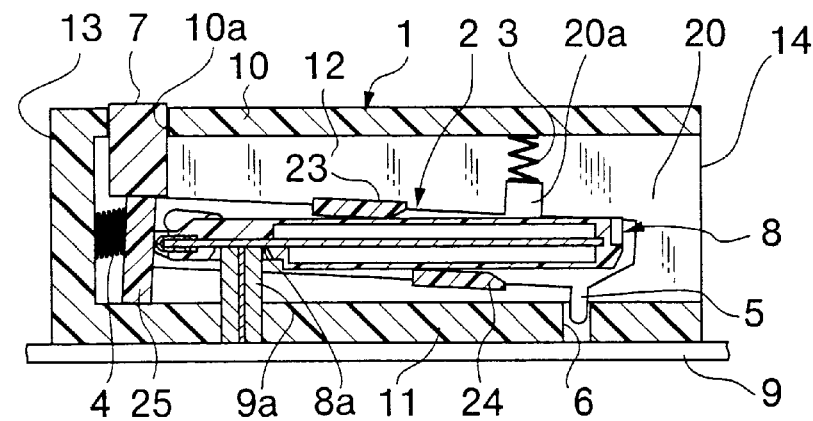
Figure 5C:
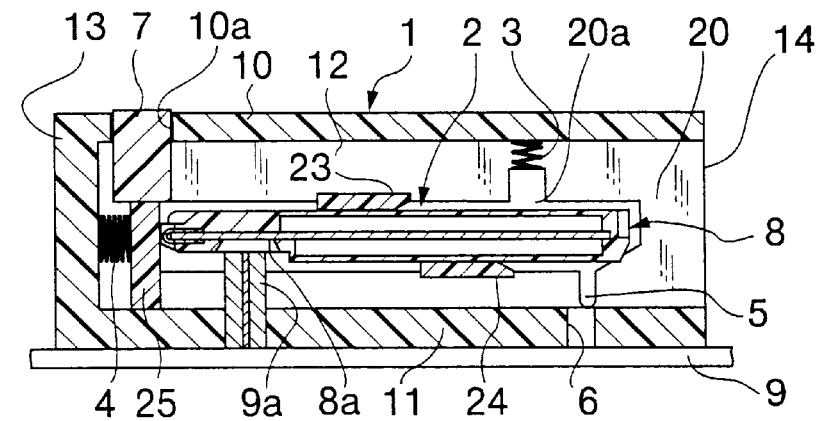

The coil springs 3 constantly urge the slider 2 against the bottom wall 11 of the insulator 1, and when the recessed terminal array portion 8a of the miniature card 8 is brought to a position exactly above the protruded terminal array portion 9a of the circuit board 9, the projections 5, 5 of the slider 2 are caused to drop into the holes 6, 6 formed in the bottom wall 11 of the insulator 1 (see FIG. 5A by the downward urging forces of the coil springs 3). As a result, the slider 2 is brought into an inclined position, thereby fitting the recessed terminal array portion 8a of the miniature card 8 on the protruded terminal array portion 9a of the circuit board 9 to effect electrical connection between the miniature card 8 and the circuit board 9.

Next, to eject the miniature card 8 from the card connector, the ejector button 7 is depressed. When the recessed terminal array portion 8a of the miniature card 8 is fitted on the protruded terminal array portion 9a of the circuit board 9, the front plate 25 of the slider 2 is located exactly under the ejector button 7 (see FIG. 5A) and is slightly tilted to the right (see the position of spring 4 in FIGS. 5A and 5B), and hence by depressing the ejector button 7, the bottom of the ejector button 7 abuts against the top of front plate 25 of the slider 2 (see FIG. 5B) and pushes it downward to an upright position (see the position of spring 4 in FIG. 5C), whereby the slider 7 is brought into a level position (see FIG. 5C) together with the miniature card 8 carried on the lower bridge 24 of the slider 2.

At this time point, the recessed terminal array portion 8a of the miniature card 8 is disconnected from the protruded terminal array portion 9a of the circuit board 9, and both the slider 2 and the miniature card 8 are pushed back in the direction of the insertion opening 14 by the urging force of the spring 4.

According to the card connector of the first embodiment, the miniature card 8 can be inserted and removed from a side of the insulator 1 (the insertion opening 14 opening at one of the four sides of the insulator 1, in the present embodiment) without deforming the protruded terminal array portion 9a of the circuit board 9. Therefore, when this card connector is employed e.g. for a digital still camera, the insertion and removal of the miniature card 8 can be performed via one of the sides of a camera casing, thereby permitting a whole top surface of the camera casing to be used as a space for mounting a liquid crystal display panel. This makes it possible to mount a large-sized liquid crystal display panel in the digital still camera without increasing the size of the casing thereof.

Figure 6:
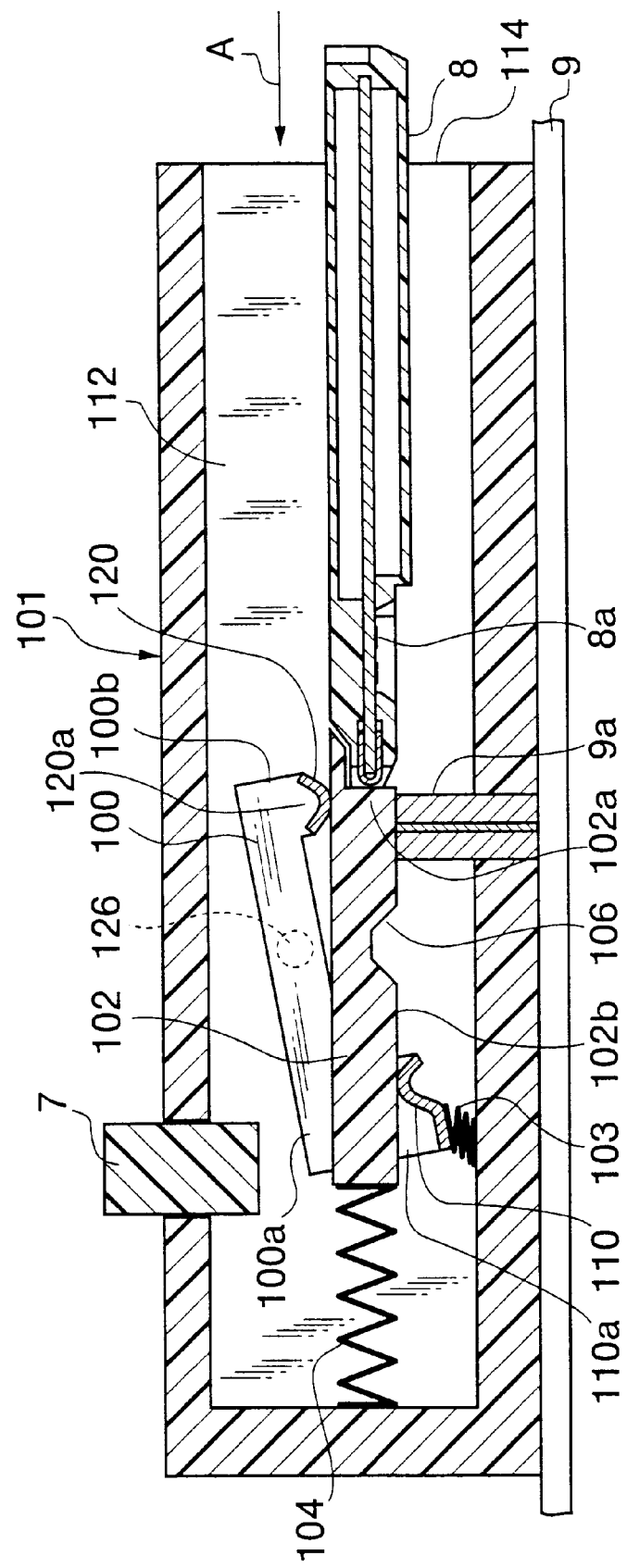
FIG. 6 is a cross-sectional view of a card connector according to a second embodiment of the invention, in a state where a card is being inserted therein.

FIGS. 6 and 7 are cross-sectional views of a card connector according to a second embodiment of the invention. FIG. 6 is a cross-sectional view showing a state in which a card is being inserted into the card connector, while FIG. 7 is a cross-sectional view showing a state in which the card has been inserted into the same. The arrangement of the guide and support means of the miniature card 8 is not shown in the figures. Component parts and elements corresponding to those of the first embodiment are designated by identical or similar reference numerals, and description thereof is omitted.

The card connector is comprised of a hollow insulator 101, a slider 102 movably accommodated within the insulator 101, a pivotally movable member 100 pivotally secured to an inner wall surface of the insulator 101 by a pivot 126, a spring (first urging member) 103 for constantly urging the pivotally movable member 100 in a clockwise direction (predetermined direction of pivotal movement of the pivotally movable member) as viewed in FIG. 6, a recess 106 formed in a bottom 102b of the slider 102, an ejector button (card-ejecting means) 7 for disengaging a recessed terminal array portion 8a of a miniature card 8 from a protruded terminal array portion 9a of a circuit board 9 fitted therein, and a spring (second urging member) 104 for constantly urging the slider 102 toward an insertion opening 114 of the insulator 101.

The pivotally movable member 100 has a front end 100a having a downwardly protruded portion 110a integrally formed with an engaging portion 110 which extends inward from the portion 110a, i.e. in a direction away from the inner wall surface to which the pivotally movable member 100 is secured. The engaging portion 110 corresponds in position to the recess 106 of the bottom 102b of the slider 102 when the recessed terminal array portion 8a of the miniature card 8 guided by the slider 102 is at a position exactly above the protruded terminal array portion 9a of the circuit board 9. The pivotally movable member 100 also has a rear end 100b having a downwardly protruded portion 120a integrally formed with a depressing portion 120 for depressing the miniature card 8, which extends inward from the portion 120a i.e. in the direction away from the inner wall to a transverse position corresponding to the miniature card 8 when it is inserted. Further, the slider 102 is inhibited from moving upward by two slider guides, not shown, formed integrally with an inner wall of the insulator 101 opposite to the inner wall to which the pivotally movable member 100 is secured, such that the slider guides extend inward therefrom.

Next, the operation of the card connector constructed as above will be explained.

When the miniature card 8 is inserted from the insertion opening 114, first, the front end of the miniature card 8 abuts against a rear end 102a of the slider 102 (see FIG. 6). Then, the miniature card 8 and the slider 102 are moved together in a card-inserting direction A within the insulator 101.

The spring 103 constantly urges the pivotally movable member 100 in the clockwise direction as viewed in FIG. 6, and hence when the recessed terminal array portion 8a of the miniature card 8 is brought to a position exactly above the protruded terminal array portion 9a of the circuit board 9, the engaging portion 110 of the pivotally movable member 100 is fitted in the recess 106 formed in the bottom 102b of the slider 102 whereby the pivotally movable member 100 pivotally moves about the pivot 126 in the clockwise direction as viewed in FIG. 6 so that the depressing portion 120 of the pivotally movable member 100 pushes down the miniature card 8 (see FIG. 7).

As a result, the recessed terminal array portion 8a of the miniature card 8 is fitted on the protruded terminal array portion 9a of the circuit board 9 to thereby electrically connect the two terminal array portions.

Next, to eject the miniature card 8 from the card connector, the ejector button 7 is depressed. The front end 100a of the pivotally movable member 100 is located exactly under the ejector button 7, and hence when the ejector button 7 is depressed, the bottom of the ejector button 7 pushes down the front end 100a of the pivotally movable member 100, whereby the pivotally movable member 100 is moved about the pivot 126 in a counterclockwise direction as viewed in FIG. 6 to disengage the engaging portion 110 of the pivotally movable member 100 from the recess 106 formed in the bottom 102b of the slider 102 and at the same time the depressing portion 120 of the pivotally movable member 100 moves away from the miniature card 8.

As a result, the downward urging force of the depressing portion 120 of the pivotally movable member 100 ceases to be applied to the miniature card 8, so that the miniature card 8 is moved upward by upward-urging means, not shown, to have the recessed terminal array portion 8a disengaged from the protruded terminal array portion 9a of the circuit board 9, and is pushed back toward the insertion opening 114 of the insulator 101 by the urging force of the spring 104 via the slider 102.

The above card connector according to the second embodiment provides the same effects as obtained by the card connector according to the first embodiment.

FIGS. 8 and 9 are cross-sectional views of a card connector according to a third embodiment of the invention. FIG. 8 is a cross-sectional view showing a state where a card is being inserted into the card connector. FIG. 9 is a cross-sectional view showing a state where the card has been inserted into the card connector. Component parts and elements corresponding to those of the above embodiment are designated by identical or similar reference numerals, and description thereof is omitted.

This card connector is comprised of a hollow insulator 201, a slider 202 which is capable of moving in the insulator 201 with a flexible printed cable (hereinafter referred to as "the FPC") 209 carried thereon, a spring (urging member) 204 for urging the slider 202 in an opposite direction to the card-inserting direction A, a flexible member 230 integrally connected to the slider 202 for supporting a protruded terminal array portion 209a of the FPC 209 from underside thereof, a recess 231 formed in a bottom 211 of the insulator 201 such that it extends toward an insertion opening 214 of the insulator 201, a locking projection 230a formed on the bottom of the flexible member 230, and a locking recess 211a formed in the bottom 211 of the insulator 201 for locking the miniature card 8 such that when the protruded terminal array portion 209a of the FPC 209 is fitted in the recessed terminal array portion 8a of the miniature card 8, the locking projection 230a is fitted in the locking recess 211a. The flexible member 230 is integrally connected to a portion of a rear end of the slider 202. When the flexible member 230 is positioned on a flat part of the bottom 21 inward of the recess 231, the flexible member 230 extends toward the insertion opening 214 in parallel with a rearward-extended flat portion 202c of the slider 202. The rearward-extended flat portion 202c supports the miniature card 8 inserted into the card connector 8 such that the recessed terminal array portion 8a of the miniature card 8 can be accessed from below. The slider 202 includes an abutment portion 202a against which the miniature card 8 abuts when it is inserted into the card connector and a spring-receiving portion 202b receiving the spring 204. The location of the protruded terminal array portion 209a of the FPC 209 corresponds to the position of the recessed terminal array portion 8a of the miniature card 8 when it abuts the abutment portion 202a of the slider 202.

The FPC 209 has one end portion thereof held on the slider 202 and another end portion thereof slidably supported in a through hole 213a formed through an innermost wall 213 of the insulator 201.

The spring 204 is arranged between the spring-receiving portion 202b of the slider 202 and the innermost wall 213 of the insulator 201.

The recess 231 is formed with a sloped guide face 231a, and progressively becomes deeper as it extends from the locking recess 211a outward toward the insertion opening 214.

The locking projection 230a of the flexible member 230 and the locking recess 211a formed in the bottom 211 of the insulator 201 forms locking means.

Next, the operation of the card connector according to the third embodiment constructed as above will be described.

When the miniature card 8 is inserted via the insertion opening 214, first, a front end thereof abuts against the abutment portion 202a of the slider 202 (see FIG. 8). At this time point, the flexible member 230 and the one end portion of the FPC 209 are parallel to the sloped guide face 231a of the recess 231, so that the protruded terminal array portion 209a of the FPC 209 is positioned away from the recessed terminal array portion 8a of the miniature card 8, i.e. down in the recess 231. Therefore, before the inserted miniature card 8 abuts against the slider 202, the miniature card 8 is not brought into contact with the protruded terminal array portion 209a of the FPC 209.

The miniature card 8 is further inserted against the urging force of the spring 204 applied to the slider 202 in a direction opposite to the card-inserting direction A whereby the slider 202 and the FPC 209 are moved in this direction, i.e. leftward as viewed in FIG. 8.

During this process, the protruded terminal array portion 209a of the FPC 209 is moved upward along the sloped guide face 231a, and at the same time the locking projection 230a of the flexible member 230 is also moved upward along the sloped guide face 231a until the FPC 209 and the flexible member 230 becomes parallel to the flat part of the bottom 211 of the insulator 201. Part of the FPC 209 is pushed out of the insulator 201 from the through hole 213a thereof and bent.

When a portion of the flexible member 230 corresponding to the protruded terminal array portion 209a of the FPC 209 has reached the flat part of the bottom 211 of the insulator 201, the protruded terminal array portion 209a of the FPC 209 is fitted in the recessed terminal array portion 8a of the miniature card 8, and at the same time the locking projection 230a of the flexible member 230 is fitted in the locking recess 211a formed in the flat part of the bottom 211 of insulator 201 (see FIG. 9).

The locking projection 230a of the flexible member 230 is fitted in the locking recess 211a, whereby a state in which the protruded terminal array portion 209a of the FPC 209 is fitted in the recessed terminal array portion 8a of the miniature card 8 is maintained against the urging force of the spring 204.

Thus, the miniature card 8 and the FPC 209 are electrically connected to each other.

Next, to eject the miniature card 8 from the card connector, an ejection device, not shown, is operated. When the injection device is operated to move the flexible member 230 upward, the locking projection 230a of the flexible member 230 is disengaged from the locking recess 211a, and the miniature card 8 is pushed back in the direction of the insertion opening 214 by the urging force of the spring 204.

When the slider 202 is moved in the opposite direction to the card-inserting direction A, the flexible member 230 and the protruded terminal array portion 209a of the FPC 209 are moved downward along the sloped guide face 231a, whereby the protruded terminal array portion 209a of the FPC 209 is moved down into the recess 231. As a result, the recessed terminal array portion 8a of the miniature card 8 is disengaged from the protruded terminal array portion 209a of the FPC 209 and only the miniature card 8 on the rear-extended portion 202c of the slider 202 is pushed back through the insertion opening 214.

The card connector according to the third embodiment provides the same effects as obtained by the card connector according to the first embodiment.

Figure 10:
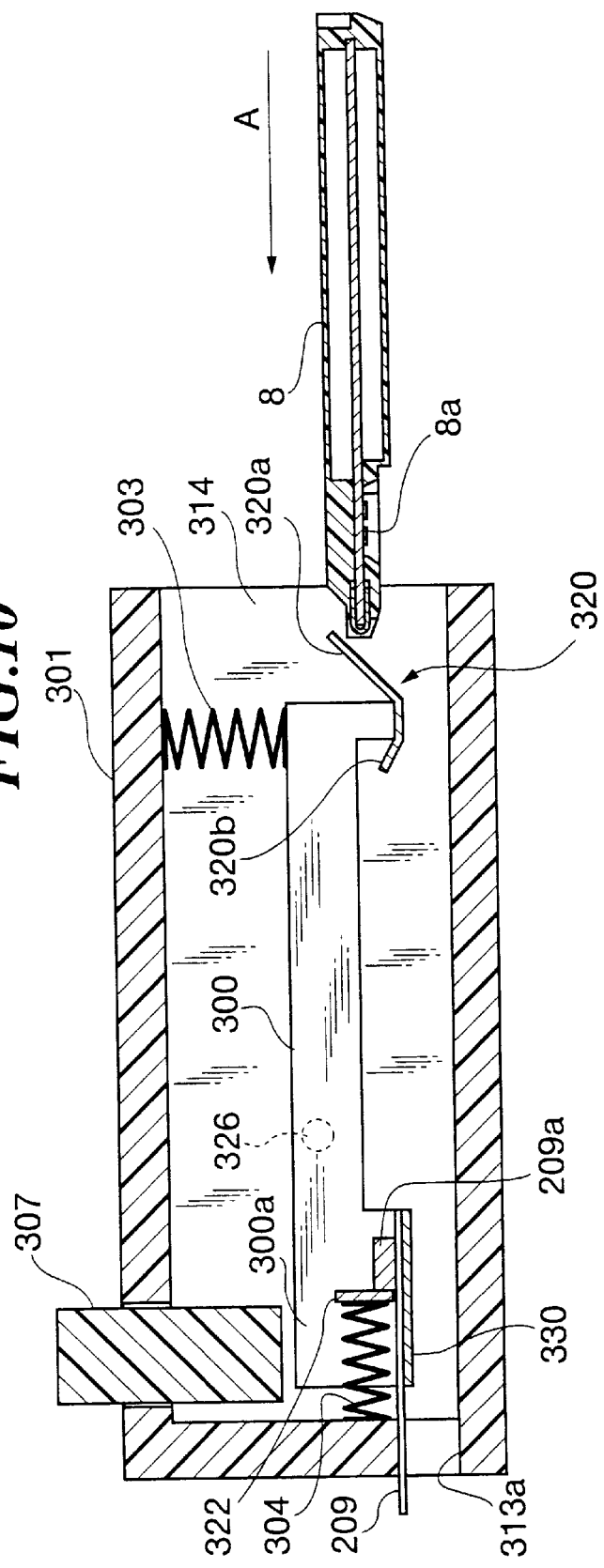
FIG. 10 is a cross-sectional view of a card connector according to a fourth embodiment of the invention, in a state where a card starts to be inserted therein.
Figure 11:
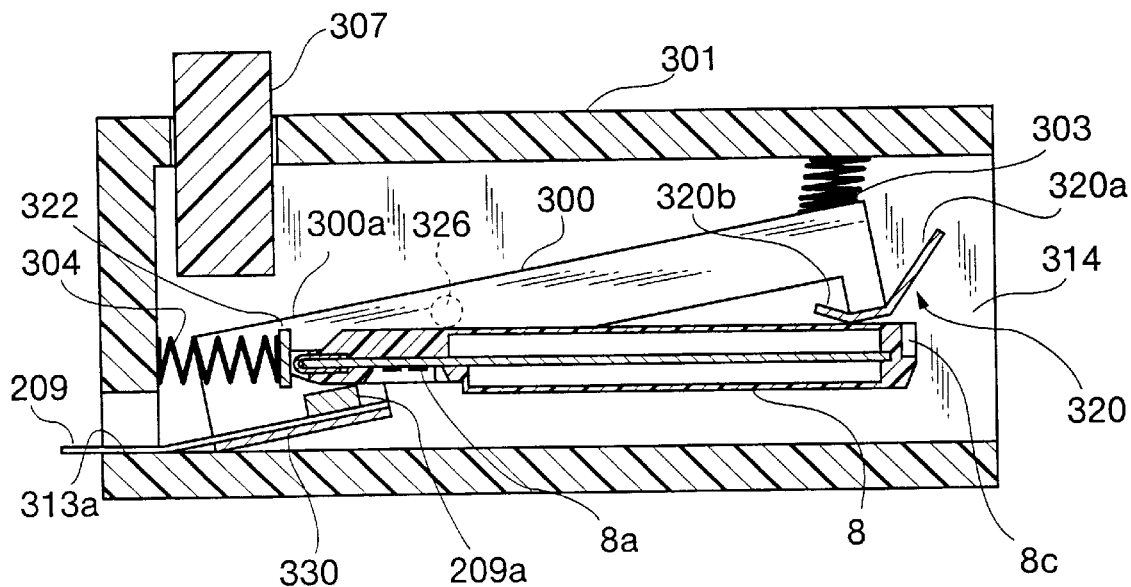
FIG. 11 is a cross-sectional view of the FIG. 10 card connector, in a state where the card is being inserted therein.
Figure 12:
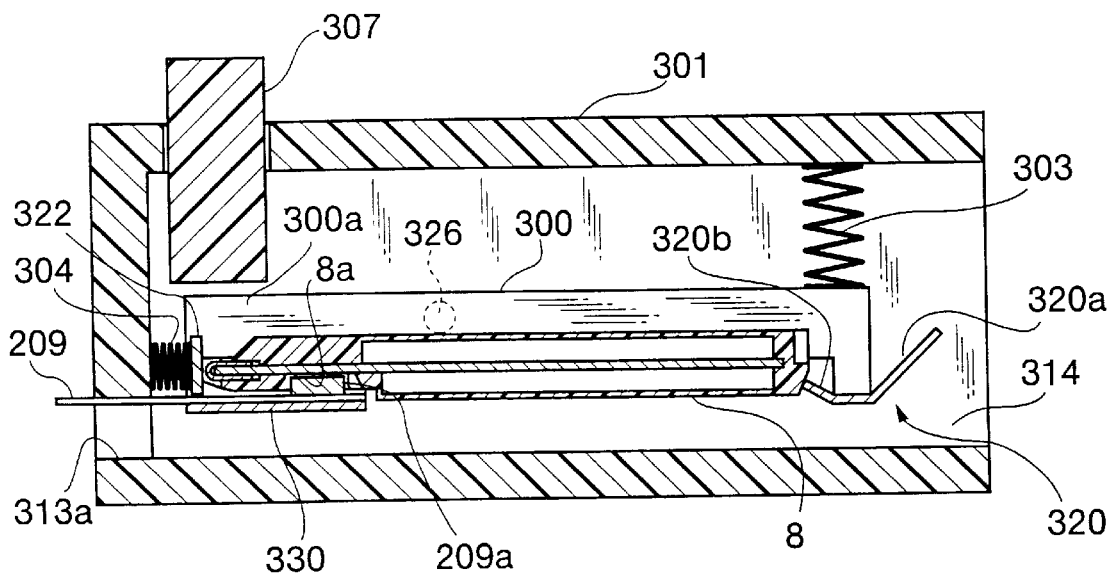
FIG. 12 is a cross-sectional view of the FIG. 10 card connector, in a state where the card has been inserted therein.

FIGS. 10 to 12 are cross-sectional views of a card connector according to a fourth embodiment of the invention. FIG. 10 is a cross-sectional view showing a state in which a miniature card starts to be inserted into the card connector. FIG. 11 is a cross-sectional view showing a state in which the miniature card is being inserted into the same. FIG. 12 is a cross-sectional view showing a state in which the miniature card has been inserted into the same. The arrangement of the guide and support means of the miniature card 8 is not shown in the figures. Component parts and elements corresponding to those of the above-mentioned embodiments are designated by identical or similar reference numerals, and description thereof is omitted.

This card connector is comprised of a hollow insulator 301, a pivotally movable member 300 pivotally secured to an inner wall surface of the insulator 301 by a pivot 326, a spring (first urging member) 303 for urging the pivotally movable member 300 in a clockwise direction (predetermined direction of pivotal movement) as viewed in FIG. 10, a lifting member 320 attached to the bottom of one end of the pivotally movable member 300 and extending inward therefrom, a support member 330 attached to the bottom of another end of the pivotally movable member 300 and extending inward therefrom, for supporting the protruded terminal array portion 209a of the FPC 209 from underside thereof, a spring (second urging member) 304 for urging the miniature card 8 in a direction opposite to a card-inserting direction A, an ejector button (card-ejecting means) 307 which pivotally moves the pivotally movable member 300 in an counterclockwise direction (direction opposite to the predetermined direction of the pivotal movement) as viewed in FIG. 10 to thereby disengage the protruded terminal array portion 209a of the FPC 209 from the recessed terminal array portion 8a of the miniature card 8.

The lifting member 320 includes a lifter plate portion 320a inclined with respect to the card-inserting direction A and projecting upward toward an insertion opening 314 of the insulator 301 and an engaging plate portion 320b inclined with respect to the card-inserting direction A and projecting upward in a direction away from the insertion opening 314.

The protruded terminal array portion 209a of the FPC 209 is supported by the support member 330, while the remaining portion of the FPC 209 extends outward through a through hole 313a formed through an innermost wall 313 of the insulator 301.

Next, the operation of the card connector according to the fourth embodiment will be described. When the miniature card 8 starts to be inserted, as shown in FIG. 10, the pivotally movable member 300 is maintained in a generally horizontal position by the coil spring 303. Further, one end of the coil spring 304 abuts against the protruded terminal array portion 209a of the FPC 209 via a plate 322.

When the miniature card 8 is inserted via the insertion opening 314, first, the front end of the miniature card 8 abuts against the lifter plate portion 320a of the lifting member 320. Since the lifter plate portion 320a is inclined with respect to the card-inserting direction A, the lifting member 320 of the pivotally movable member 300 is lifted by the inserted miniature card 8 to thereby pivotally move the pivotally movable member 300 about the pivot 326 in an counterclockwise direction as viewed in FIG. 10 (see FIG. 11) to be inclined with respect to the card-inserting direction A, so that the lifting member 320 of the pivotally movable member 300 is relatively slid on the top of the miniature card 8.

Thereafter, the front end of the miniature card 8 abuts against the plate 322, and the miniature card 8 is further inserted against the urging force of the coil spring 304. During the process, the pivotally movable member 300 is inclined with respect to the card-inserting direction A and the support member 330 supporting the protruded terminal array portion 209a of the FPC 209 is moved downward, so that the front end of the miniature card 8 does not run against the protruded terminal array portion 209a.

The coil spring 303 constantly urges the pivotally movable member 300 in the clockwise direction as viewed in FIG. 10 and hence when the recessed terminal array portion 8a of the miniature card 8 is brought to a position exactly above the protruded terminal array portion 209a of the FPC 209, the pivotally movable member 300 is pivotally moved in the clockwise direction as viewed in FIG. 10 to receive the protruded terminal array portion 209a of the FPC 209 in the recessed terminal array portion 8a of the miniature card 8 (see FIG. 12) whereby the two terminal array portions 209a, 8a are engaged with each other to effect electrical connection of them.

At this time point, the engaging plate portion 320b of the lifting member 320 engages a lower portion of a rear end of the miniature card 8. In this state, a rotation moment of the pivotally movable member 300 in the clockwise direction as viewed in FIG. 12 and a rotation moment of the same in the counterclockwise direction as viewed in the same are balanced whereby the pivotally movable member 300 is held in a horizontal position. This maintains the engagement of the protruded terminal array portion 209a of the FPC 209 and the recessed terminal array portion 8a of the miniature card 8 against the urging force of the coil spring 304 to thereby maintain electrical connection between the miniature card 8 and the FPC 209.

Next, to eject the miniature card 8 from the card connector, the ejector button 307 is depressed. The one end 300a of the pivotally movable member 300 is located exactly under the ejector button 307, so that when the ejector button 307 is depressed, the bottom of the ejector button 307 pushes the one end 300a of the pivotally movable member 300 downward. As a result, the pivotally movable member 300 is pivotally moved in the counterclockwise direction as viewed in FIG. 10 to disengage the protruded terminal array portion 209a of the FPC 209 from the recessed terminal array portion 8a of the miniature card 8, and the engaging plate portion 320b of the lifting member 320 is disengaged from the rear end of the miniature card 8, whereupon the miniature card 8 is pushed back toward the insertion opening 314 of the insulator 301 by the urging force of the coil spring 304.

The card connector according to the fourth embodiment provides the same effects as obtained by the card connector according to the first embodiment.

FIGS. 13 and 14 are cross-sectional views of a card connector according to a fifth embodiment of the invention. FIG. 13 is a cross-sectional view showing a state in which a miniature card is being inserted into the card connector. FIG. 14 is a cross-sectional view showing a state in which the miniature card has been inserted into the same. Component parts and elements corresponding to those of the above-mentioned embodiments are designated by identical or similar reference numerals, and description thereof is omitted.

This card connector is comprised of a hollow insulator 401, a slider 402 movably accommodated within the insulator 401, a recess 402a formed in the top of the slider 402, a pivotally movable member 400 pivotally secured to an inner wall surface of the insulator 401 by a pivot 426, a spring (first urging member) 403 for urging the pivotally movable member 400 in a counterclockwise direction (predetermined direction of pivotal movement) as viewed in FIG. 13, an engaging member 420 which is attached to the bottom of one end 400a of the pivotally movable member 400 in a manner enclosing a convex portion 420a formed at the bottom of the one end 400a and extends inward therefrom to a location corresponding in transverse position to the recess 402a of the top of the slider 402, a support member 406 which is attached to the bottom of a downward protruded portion 406a of the other end 400b of the pivotally movable member 400 and extends therefrom inward to the protruded terminal array portion 209a of the FPC 209 to support the same from underside thereof, an ejector button (card-ejecting means) 407 for pivotally moving the pivotally movable member 400 in the clockwise direction (direction opposite to the predetermined direction of the pivotal movement) as viewed in FIG. 13 to thereby disengage the protruded terminal array portion 209a of the FPC 209 from the recessed terminal array portion 8a of the miniature card 8, and a spring (second urging member) 404 for urging the slider 402 toward an insertion opening 414 of the insulator 401.

One end (protruded terminal array portion 209a) of the FPC 209 is supported from underside thereof by the support member 406, while the other end of the FPC 209 slidably extends through a through hole 413a of the insulator 401. The spring 404 is arranged between the slider 402 and an innermost wall 413 of the insulator 401.

Next, the operation of the card connector according to the fifth embodiment constructed as above will be described.

When the miniature card 8 is inserted via the insertion opening 414, first, the front end of the miniature card 8 abuts against a rear end 410 of the slider 402 (see FIG. 13). The engaging member 420 of the pivotally movable member 400 is located on the top of the slider 402 and the pivotally movable member 400 is inclined with respect to the card-inserting direction A.

Then, the miniature card 8 and the slider 402 are moved together in the card-inserting direction A within the insulator 401. Since the pivotally movable member 400 is inclined with respect to the card-inserting direction A and the support member 406 supporting the protruded terminal array portion 209a thereon is in a downward-shifted position, so that the front end of the miniature card 8 does not abut against the protruded terminal array portion 209a of the FPC 209.

When the recessed terminal array portion 8a of the miniature card 8 is brought to a position exactly above the protruded terminal array portion 209a of the FPC 209, the engaging member 420 of the pivotally movable member 400 is fitted in the recess 406 of the top of the slider 402 and the pivotally movable member 400 is pivotally moved about the pivot 426 in the counterclockwise direction as viewed in FIG. 13, so that the support member 405b lifts the protruded terminal array portion 209a of the FPC 209 to thereby fit or engage the protruded terminal array portion 209a of the FPC 209 in the recessed terminal array portion 8a of the miniature card 8 (see FIG. 14), i.e. effect engagement of the two terminal array portions 209a and 8a. The engagement of the engaging member 420 of the pivotally movable member 400 in the recess 406 of the slider 402 holds the pivotally movable member 400 in a horizontal position, so that the engagement of the recessed terminal array portion 8a of the miniature card 8 and the protruded terminal array portion 209a of the FPC 209 is maintained against the urging force of the spring 404 to thereby maintain electrical connection of the two terminal array portions.

Next, to disengage the miniature card 8 from the FPC 209, the ejector button 407 is depressed. Since the other end 400b of the pivotally movable member 400 is located exactly under the ejector button 407, when the ejector button 407 is depressed, the bottom of the ejector button 407 pushes the other end 400b of the pivotally movable member 400 downward. As a result, the pivotally movable member 400 is pivotally moved in the clockwise direction as viewed in FIG. 13, whereby the engaging member 420 of the pivotally movable member 400 is disengaged from the recess 406 of the top of the slider 402 and at the same time the protruded terminal array portion 209a of the FPC 209 is disengaged from the recessed terminal array portion 8a of the miniature card 8.

As a result, the miniature card 8 is pushed back in the direction of the insertion opening 414 of the insulator 401 by the urging force of the spring 404 applied thereto via the slider 402.

The card connector according to the fifth embodiment provides the same effects as obtained by the card connector according to the first embodiment.

Figure 15:
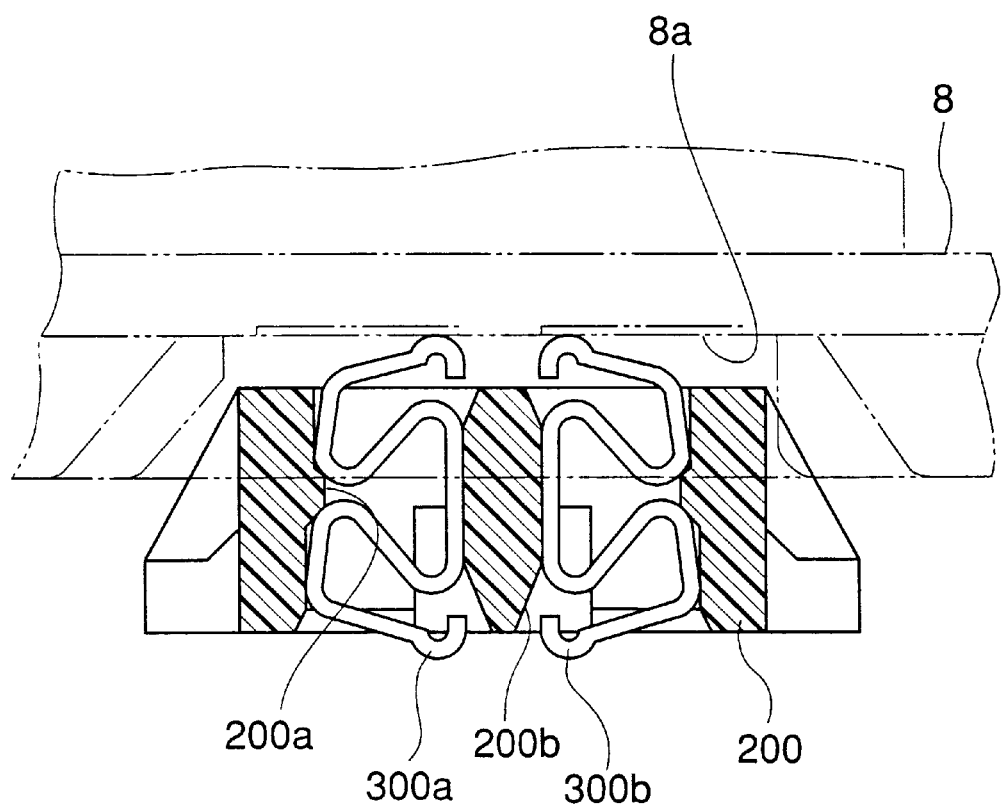
FIG. 15 is a cross-sectional view showing a protruded terminal array portion of another circuit board.

FIG. 15 is a cross-sectional view showing a metal protruded terminal array portion for a circuit board other than one employed in the above embodiments.

Although in the above embodiments, description is made of cases in which electrically conductive rubber is used for the protruded terminal array portion 9a of the circuit board, a metal terminal as shown in FIG. 15 may be employed as the protruded terminal array portion 9a.

This metal terminal is comprised of an insulator 200 and contacts 300a, 300b inserted into holes 200a, 200b formed through the insulator 200. The contacts 300a, 300b are formed by bending an electrically conductive metal into a predetermined shape so as to obtain the resilient properties.

Further, although in the above embodiments, description is made of cases in which a miniature card is used 8 as the card, this is not limitative, but various kinds of cards other than the miniature card may be employed.

As described above, according to the card connector of the present invention, a card can be inserted therein and removed therefrom via one of the sides of an insulator thereof without deforming a protruded terminal array portion of a circuit board or a flexible printed cable contained therein. Therefore, when this card connector is applied to a digital still camera, the card can be inserted and removed from one of the sides of the camera casing, which enables the whole top surface of the camera casing to be utilized as a space for mounting a liquid crystal display panel, and therefore it is possible to mount a large-sized liquid crystal display panel in the digital still camera without increasing the size of the casing thereof.

It is further understood by those skilled in the art that the foregoing is the preferred embodiment of the invention, and that various changes and modification may be made without departing from the spirit and scope thereof.

What is claimed is:

1. A card connector for electrically connecting a card to a circuit board, said card connector including a hollow insulator having a bottom wall and an insertion opening through which said card is inserted therein, and a protruded terminal array portion of said circuit board, which extends through said bottom wall of said hollow insulator to protrude into an inside of said hollow insulator, said card having a recessed terminal array portion, wherein said protruded terminal array portion and said recessed terminal array portion are arranged to be engaged with each other for electrical connection between said card and said circuit board, the card connector further comprising:

a slider movably accommodated within said hollow insulator for guiding said card to said protruded terminal array portion, said slider having a rear end;

a protruded portion formed on a bottom of said rear end of said slider;

a first urging member for urging said slider toward said bottom of said hollow insulator;

said bottom wall of said hollow insulator having a hole formed therein, said hole being formed at a location which engages with said protruded portion of said slider when said recessed terminal array portion of said card guided by said slider is at a position exactly above said protruded terminal array portion of said circuit board, whereby when said recessed terminal array portion of said card is brought to said position exactly above said protruded terminal array portion, said protruded portion of said slider is caused to drop into said hole by an urging force of the first urging member so that said slider is brought into an inclined position which is inclined with respect to a direction of insertion of said card to thereby cause said recessed terminal array portion of said card to engage with said protruded terminal array portion of said circuit board; card-ejecting means for returning said card from said inclined position to a level position to thereby disengage said recessed terminal array portion of said card from said protruded terminal array portion of said circuit board; and a second urging member for pushing back said slider toward said insertion opening of said hollow insulator when said recessed terminal array portion of said card is disengaged from said protruded terminal array portion of said circuit board by said card-ejecting means.

2. A card connector according to claim 1, wherein:

said slider has a front end portion against which said card abuts when said card is inserted into said hollow insulator; said hollow insulator has a top wall and;

said card-ejecting means is arranged in said top wall at a location corresponding in position to said front end portion of said slider when said protruded portion of said slider has been caused to drop into said hole of said bottom wall of said hollow insulator, for depressing said front end portion of said slider.

3. A card connector according to claim 2, wherein:

said hollow insulator has a front wall and;

said second urging member comprises a coil spring arranged between said front wall of said hollow insulator and said front end portion of said slider.

4. A card connector according to claim 2, wherein:

said slider has side members opposed to each other;

said side members have respective top portions and;

said first urging member comprising coil springs fixed to said respective top portions of said side members.

5. A card connector according to claim 2, wherein:

said slider has side members opposed to each other; said side members have respective bottom portions and;

said slider has a a cross-member extending between said bottom portions of said side members for supporting said card.

* * * * *